United States Patent
Gicquel et al.

(10) Patent No.: US 10,078,395 B2
(45) Date of Patent: Sep. 18, 2018

(54) DIFFERENTIAL SENSING IN TOUCH SCREEN CONTROLLER WITH IMPROVED NOISE REJECTION

(71) Applicant: STMicroelectronics Asia Pacific Pte Ltd, Singapore (SG)

(72) Inventors: Hugo Gicquel, Singapore (SG); Leonard Liviu Dinu, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 89 days.

(21) Appl. No.: 15/386,249

(22) Filed: Dec. 21, 2016

(65) Prior Publication Data

US 2018/0173361 A1    Jun. 21, 2018

(51) Int. Cl.
*G06F 3/041* (2006.01)
*G06F 3/044* (2006.01)
*H01L 27/092* (2006.01)

(52) U.S. Cl.
CPC ............ *G06F 3/0416* (2013.01); *G06F 3/044* (2013.01); *H01L 27/092* (2013.01)

(58) Field of Classification Search
CPC ....... G06F 3/0416; G06F 3/044; H01L 27/092
See application file for complete search history.

(56) References Cited

U.S. PATENT DOCUMENTS

| | | | | |
|---|---|---|---|---|
| 9,383,395 | B1* | 7/2016 | Ogirko | G01R 27/2605 |
| 9,898,149 | B2* | 2/2018 | Kang | G06F 3/044 |
| 2014/0292375 | A1* | 10/2014 | Angelini | G06G 7/00 327/94 |
| 2015/0029141 | A1* | 1/2015 | Jo | G06F 3/044 345/174 |
| 2015/0338952 | A1* | 11/2015 | Shahparnia | G06F 3/044 345/174 |

* cited by examiner

*Primary Examiner* — Andrew Sasinowski
(74) *Attorney, Agent, or Firm* — Crowe & Dunlevy

(57) ABSTRACT

Disclosed herein is an electronic device including a display layer generating display noise based on scanning thereof and a sensing layer including a plurality of sense lines. The display noise is capacitively coupled from the display layer to each of the plurality of sense lines of the sensing layer. A differential charge converter circuit has first and second differential inputs respectively coupled to corresponding ones of the plurality of sense lines, and first and second reference inputs. The first and second reference inputs of the differential charge converter circuit are coupled to voltage references during a reset period, and are decoupled from the voltage references during a scan period.

24 Claims, 4 Drawing Sheets

DIFFERENTIAL SENSING IN TOUCH SCREEN CONTROLLER WITH IMPROVED NOISE REJECTION

TECHNICAL FIELD

This disclosure is related to the field of touch screen displays, and more particularly to the rejection of display noise using differential sensing.

BACKGROUND

Handheld electronic devices such as smartphones, tablets, and smartwatches are popular with consumers and are sold in great numbers. The majority of these devices employ a touch sensitive display for both display of output to a user and accepting data as input from a user. Most of these touch sensitive displays utilize capacitive touch sensing.

A typical such touch sensitive display includes a display layer constructed from technology such as LCD, IPS, or AMOLED, as well as a sensing layer. A typical sensing layer includes a plurality of parallel drive lines, and a plurality of parallel sense lines. The sense lines capacitively intersect the drive lines. In operation, a single drive line is driven with a wave, such as a square wave or sine wave. The capacitance between the sense lines and the driven drive line is sensed at the point where they intersect. Presence of a human finger or a conductive object alters the expected capacitance at the intersection point, and by measuring the change in capacitance, a touch between the finger or object and the touch sensitive display can be detected.

Consumer desires for these handheld electronic devices are for the devices to grow increasingly thin. This accordingly results in the desire to make touch sensitive displays increasingly thin. However, as such touch sensitive displays grow thinner, noise from the display layer becomes an increasing problem for the sensing layer, as the thinner designs result in greater parasitic capacitances coupling the noise from the display layer through to the sensing layer. This noise, when coupled through to the sensing layer, degrades accuracy of the touch sensing performed by the sensing layer, which is commercially undesirable.

While methods of reducing the coupling of this noise from the display layer through to the sensing layer are known, and while methods of rejecting the noise that is coupled through are known, those methods may still allow an undesirable amount of display noise to be coupled through to the sensing layer. Therefore, further development is still needed.

SUMMARY

This summary is provided to introduce a selection of concepts that are further described below in the detailed description. This summary is not intended to identify key or essential features of the claimed subject.

An electronic device includes a display layer generating display noise based on scanning thereof and a sensing layer including a plurality of sense lines. The display noise is capacitively coupled from the display layer to each of the plurality of sense lines of the sensing layer. A differential charge converter circuit has first and second differential inputs respectively coupled to corresponding ones of the plurality of sense lines, and first and second reference inputs. The first and second reference inputs of the differential charge converter circuit are coupled to voltage references during a reset period, and are decoupled from the voltage references during a scan period. The first differential input and the second reference input are capacitively cross coupled during the reset period, and the second differential input and the first reference input are capacitively cross coupled during the reset period.

Also disclosed herein is a charge converter for use in a touch screen. The charge converter may include a differential input stage, which itself may have a first NMOS transistor with a gate, and a source to be coupled to a first differential sense node. A second NMOS transistor has a gate, and having a source to be coupled to a second differential sense node. A first PMOS transistor has a gate, and has a source to be coupled to the first differential sense node. A second PMOS transistor has a gate, and has a source to be coupled to the second differential sense node. A conversion circuit has first and second inputs to be coupled to the first and second differential sense nodes respectively, and is configured to convert a difference in charge between the first and second differential sense nodes.

A first capacitive coupling may be between the gate of the first NMOS transistor and the second differential sense node. A second capacitive coupling may be between the gate of the second NMOS transistor and the first differential sense node. A third capacitive coupling may be between the gate of the first PMOS transistor and the second differential sense node. A fourth capacitive coupling may be between the gate of the second PMOS transistor and the source of the first PMOS transistor.

A method aspect disclosed herein includes capacitively coupling display noise from a display layer to each of a plurality of sense lines. The method includes coupling a plurality of differential charge converter circuits to the plurality of sense lines and to voltage references during a reset period, and coupling the plurality of differential charge converter circuits to the plurality of sense lines and not to the voltage references during a scan period. The display noise may be rejected during the scan period by capacitively coupling the display noise to gates and sources of capacitively cross coupled transistors of the plurality of differential charge converter circuits.

DETAILED DESCRIPTION

The present description is made with reference to the accompanying drawings, in which example embodiments are shown. However, many different embodiments may be used, and thus the description should not be construed as limited to the embodiments set forth herein. Rather, these embodiments are provided so that this disclosure will be thorough and complete. Like numbers refer to like elements throughout.

Figure 1:
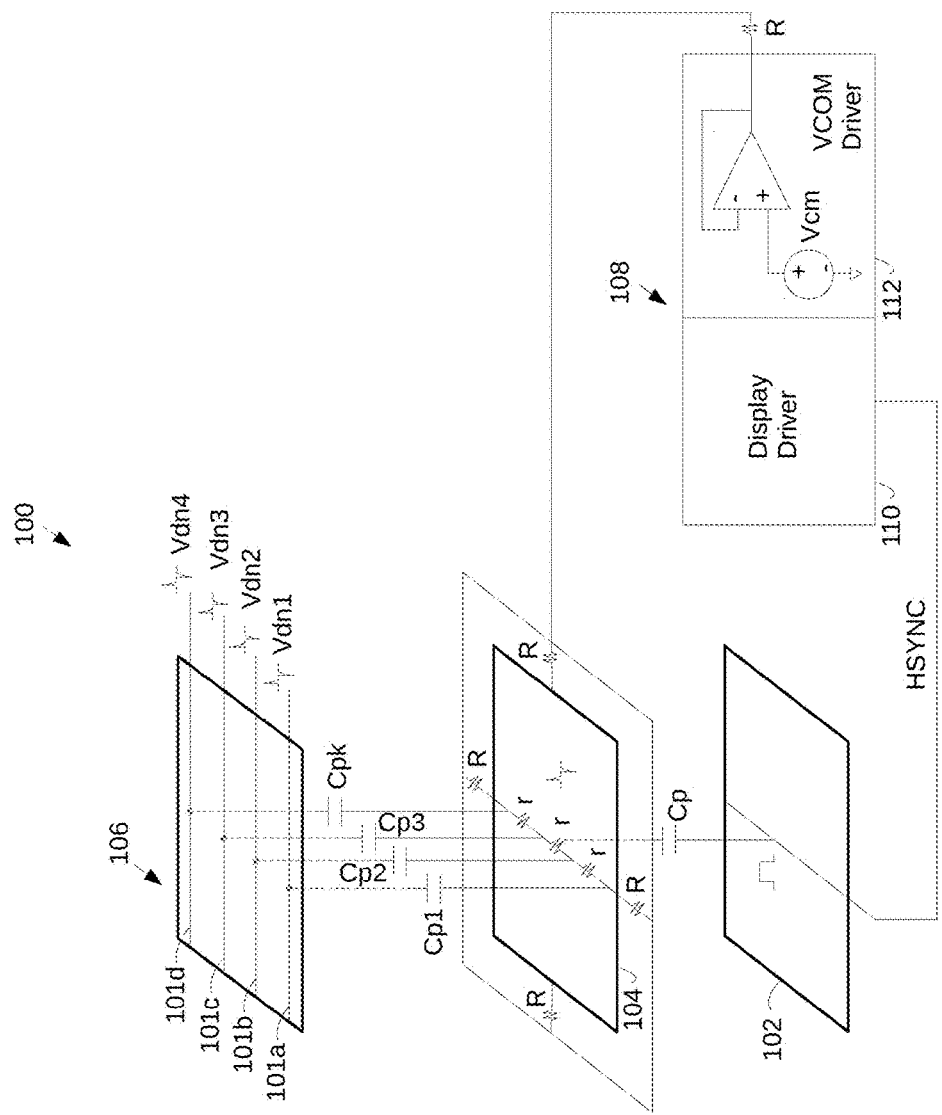
FIG. 1 is schematic block diagram of touch screen in which display noise is coupled through to a plurality of sense lines.

With initial reference to FIG. 1 a touch sensitive display 100 for an electronic device is now described. The electronic device may be a smartphone, smartwatch, tablet, laptop, or other suitable portable electronic device. The touch sensitive display 100 includes a display layer 102 with a common voltage layer (VCOM) 104 thereon. A touch sensing layer 106 is over the VCOM layer 104.

Figure 2:
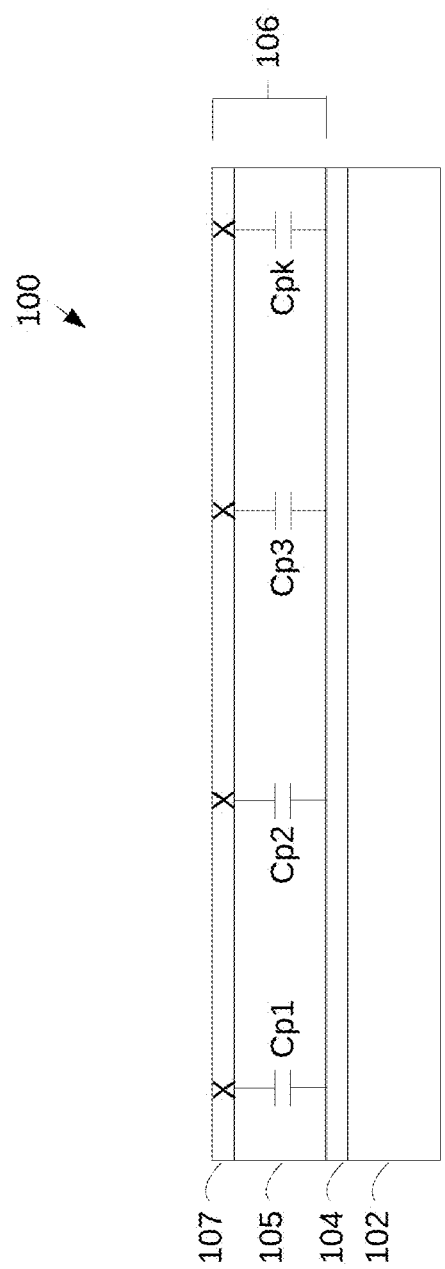
FIG. 2 is a schematic cross sectional diagram of the touch screen of FIG. 1 showing the arrangement of the display layer, VCOM layer, and sensing layer, as well as the parasitic capacitances coupling the display noise to the sensing layer.

As best shown in FIG. 2, the touch sensing layer 106 is comprised of a substrate 105 having a touch sensor 107 formed thereon. The touch sensor 107 itself is formed by capacitively intersecting sense lines 101a-101d and a drive line 109. Although four sense lines 101a-101d are shown, there may be any number of such sense lines. Although one drive line 109 is shown, there may be any number of such drive lines.

A touch is detected via measuring the capacitance between the sense lines 101a-101d and the drive line 109. The VCOM layer 104 provides a common voltage for both the sensing layer 106 and the display layer 102. The VCOM layer 104 is supplied at multiple points about its perimeter, illustrated in FIG. 1. The common voltage is based upon a voltage reference Vcom.

Due to this VCOM layer 104, as will be explained in detail below, parasitic capacitances Cp1-Cp4 are formed between the sensing layer 106 and the VCOM layer 104, and a parasitic capacitance Cp is formed between the VCOM layer 104 and the display layer 102. For simplicity, four parasitic capacitances Cp1-Cp4 are shown, but it should be understood that there may be any number of parasitic capacitances formed between the sensing layer 106 and the VCOM layer 104, and between the VCOM layer 104 and the display layer 102.

The display layer 102 contains rows and columns of pixels that are scanned so as to form an image for display to a user. The display layer 102 is coupled to a display driver 110 which controls the display layer 102 using a horizontal sync signal HSYNC, which is a pulse that synchronizes the start of scanning of a row.

In operation, the drive line 109 is driven with a periodic signal, such as a square wave. At the intersection point between the drive line 109 and sense lines 101a-101d, the sense lines 101a-101d incur a charge injection proportional to the voltage at the drive line 109 and a capacitance between the sense lines 101a-101d and the drive line 109 at that intersection point. This capacitance varies in proximity to conductive objects, such as human fingers, and is measured and processed by a touch screen controller (TSC) 150 so as to generate touch data for use by the electronic device.

Figure 3:
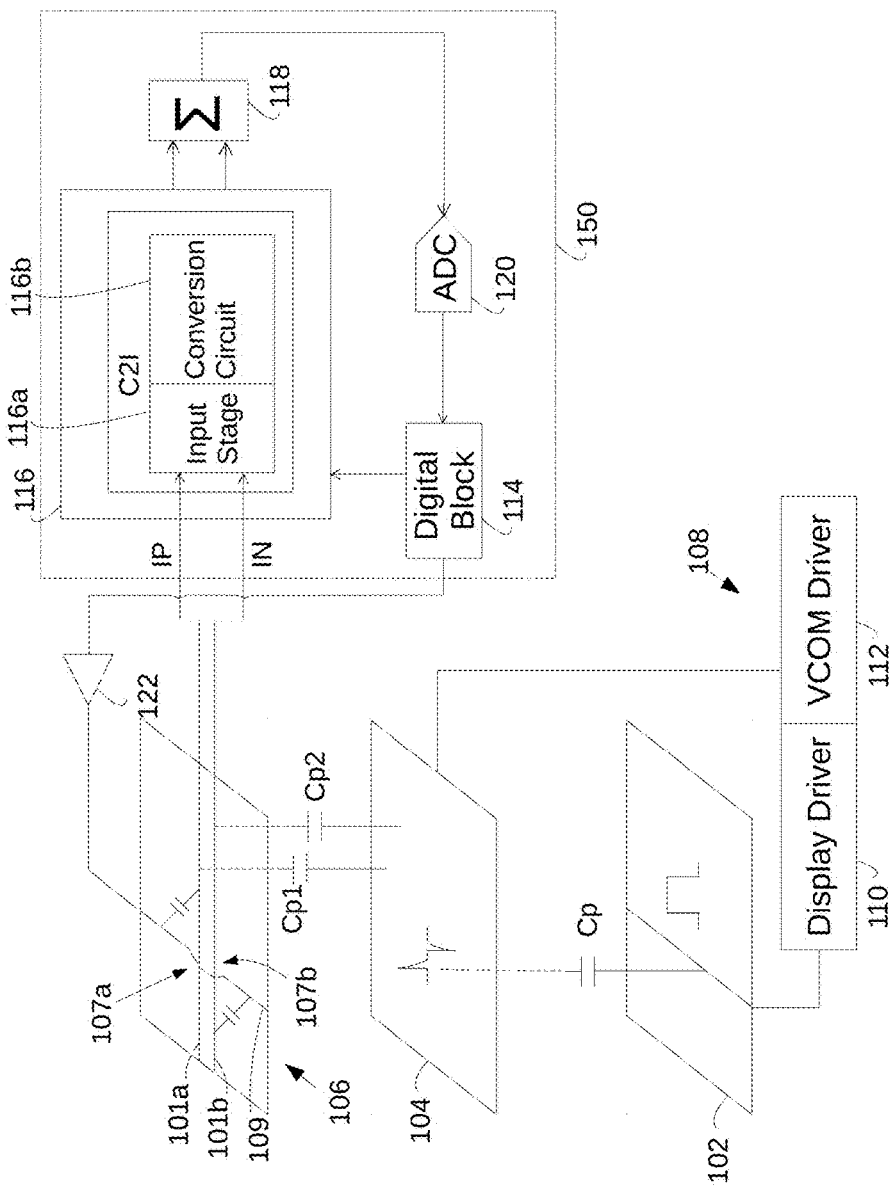
FIG. 3 is a schematic block diagram of the touch screen of FIG. 1, incorporating differential noise rejection in two of the sense lines in accordance with this disclosure.

Greater detail of the TSC 150 with reference to its operation on two sense lines 101a, 101b and the drive line 109 will now be given with reference to FIG. 3. The touch screen controller 150 includes a driver 122 coupled to the drive line 109 and controlled by a drive (or "force") signal Tx from the digital block 114. The sense lines 101a, 101b are coupled to charge to current (C2I) converter circuit 116. The C2I 116 is coupled to an accumulator 118, which in turn is coupled to an analog to digital converter (ADC) 120, which is coupled to the digital block 114.

Generation of the touch data will now be described. The drive line 109 is driven with a periodic signal by the driver 122, under control of the digital block 114. At the intersection point between the drive line 109 and sense line 101a, as well as sense line 101b, the sense lines 101a, 101b incur a charge injection proportional to the voltage at the drive line 109 and a capacitance between the sense lines 101a, 101b and the drive line 109 at that intersection point. The C2I 116 amplifies a difference between the charge on the sense lines 101a, 101b, rejects noise common to sense lines 101a, 101b, multiplies the difference by a gain, and generates differential output currents as a function of the difference and the gain.

The accumulator 118 amplifies a difference between the currents and generates a voltage based thereupon, each time the driving signal transitions. In addition, the accumulator 118 serves to store and sum (accumulate) these voltages in response to transitions of the driving signal. By way of example, if the driving signal is a square wave having 32 transitions (16 transitions from low to high, and 16 transitions from high to low-low), then for each transition the accumulator 118 converts the difference between the currents to a voltage and updates the voltage sum, therefore accumulating the voltages, until it has stored 32 times the voltage corresponding to one transition of the driver.

The analog to digital converter 120 converts the voltage sums to the digital domain and passes them to the digital block 114. The digital block 114 processes the voltage sums to produce touch data, which it outputs.

The inventors have found that, at each HSYNC pulse, noise is capacitively coupled from the display layer 102 into the VCOM layer 104 via the parasitic capacitance Cp. Then, that noise is capacitively coupled from the VCOM layer 104 into the sensing layer 106 via the parasitic capacitances Cp1-Cp4. This noise causes unwanted charge injection which would degrade the accuracy and performance of the touch data generated by the touch screen controller 150.

In greater detail, the VCOM layer 104 is a reference plane that is resistive. It is driven by a VCOM driver 112 through wires having a routing resistance R, at multiple connection points. Although four connection points are shown, other numbers of connection points may be used. The result of the VCOM layer 104 being driven at different connection points is that the amplitude of the display noise seen on the VCOM layer 104 is dependent on the position on the VCOM layer 104 at which the display noise is measured. Near the connection points, the amplitude of the display noise in the VCOM layer is less than far from the connection points.

It follows then that the amplitude of the display noise coupled through from the VCOM layer 104 to each sense lines 101a-101d depends on the location of each sense line relative to the connection points of the VCOM layer 104. Thus, each sense line 101a-101d may be subject to display noise of a different amplitude due to the location of that sense line relative to the connection points of the VCOM layer 104. Adding to this is the fact that the parasitic capacitances Cp1-Cp4 that couple the display noise from the VCOM layer 104 to the sense lines 101a-101d are not equal in value. Thus, the amplitude of the display noise experienced at the different sense lines 101a-101d may differ between 0% and 15%.

Differential sensing techniques may be used to reject at least some of this display noise. However, due to the different amplitudes of display noise at different sense lines 101a-101d, the level of noise reduction may not be as high as desired.

Therefore, the C2I 116 incorporates circuitry and techniques to use differential sensing to reject display noise, while avoiding the drawbacks of prior art differential sensing techniques.

The charge to current converter circuit 116 includes an input stage 116a and a conversion circuit 116b. The input stage 116a serves to cancel out display noise, such that the display noise is attenuated or not present in the signals converted by the conversion circuit 116b.

Figure 4:
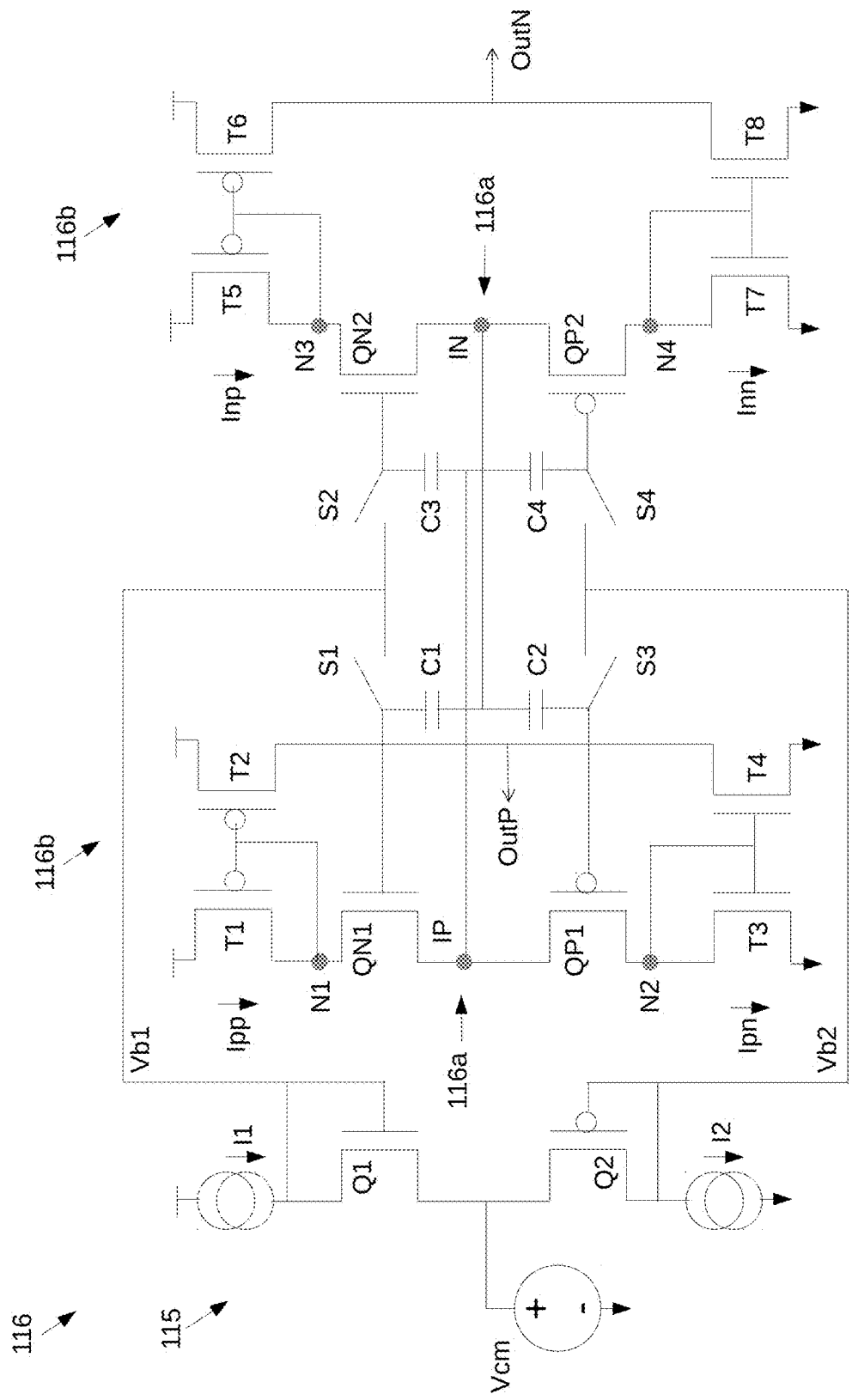
FIG. 4 is a detailed schematic diagram of a differential translinear current input stage of the charge to current converter of FIG. 3.

Details of the C2I circuit 116 will now be given below with reference to FIG. 4. Within the C2I 116 is a reference voltage generation circuit 115. The reference voltage generation circuit 115 includes first diode coupled transistor Q1 having its drain coupled to current source I1, its source coupled to the voltage reference Vcm, and its gate coupled to switch S1. The gate of transistor Q1 is also coupled to the drain of transistor Q1. The reference voltage generation circuit 115 also includes a second diode coupled transistor Q2 having its source coupled to the voltage reference Vcm, its drain coupled to current source I2, and its gate coupled to switch S2. The gate of transistor Q2 is also coupled to the drain of transistor Q2.

The input stage 116a of the charge to current converter circuit 116 includes a first NMOS transistor QN1 having its drain coupled to node N1, its source coupled to differential input IP, and its gate coupled to switch S1. The input stage 116a also includes a first PMOS transistor having its source coupled to differential input IP, its drain coupled to node N2, and its gate coupled to switch S3. The input stage 116a further includes a second NMOS transistor QN2 having its drain coupled to node N3, its source coupled to differential input IN, and its gate coupled to switch S2. The input stage also 116a also includes a second PMOS transistor QP2 having its source coupled to differential input IN, its drain coupled to node N4, and its gate coupled to switch S4. Capacitors C1 and C2 cross couple the gates of QN1 and QP1 to the differential input IN. Capacitors C3 and C4 cross couple the gates of QN2 and QP2 to the differential input IP.

The conversion circuit 116b includes PMOS transistor T1 having its source coupled to the supply node, its drain coupled to node N1, and its gate coupled to the gate of PMOS transistor T2 which is in a current mirror relationship with transistor T1. The conversion circuit 116b also includes NMOS transistor T3 having its drain coupled to node N2, its source coupled to ground, and its gate coupled to the gate of NMOS transistor T4 which is in a current mirror relationship with transistor T3. The drains of transistors T2 and T4 are coupled, and the signal OutP is generated therefrom.

The conversion circuit 116b includes PMOS transistor T5 having its source coupled to the supply node, its drain coupled to node N3, and its gate coupled to the gate of PMOS transistor T6 which is in a current mirror relationship with transistor T5. The conversion circuit 116b also includes NMOS transistor T7 having its drain coupled to node N4, its source coupled to ground, and its gate coupled to the gate of NMOS transistor T8 which is in a current mirror relationship with transistor T7. The drains of transistors T6 and T8 are coupled, and the signal OutN is generated therefrom.

The digital block 114, described above, controls switches S1, S2, S3, S4. In particular, during a reset period, the digital block 114 closes switches S1, S2, S3, S4. The closing of the switches S1, S2, S3, S4 serves to bias the gates of QN1, QP1, QN2, and QP2 such that their sources are equal to Vcm, and the currents Ipp, Ipn are mirrors of currents I1 and I2, such that the currents Inp and Inn are also mirrors of currents I1 and I2.

In a scanning period the digital block 114 opens switches S1, S2, S3, S4. This opening of switches S1, S2, S3, S4 serves to decouple the gates and sources of transistors QN1, QP1, QN2, and QP2 from the gate voltage references. Thus, the gates to the transistors QN1, QP1, QN2, and QP2 float during the scanning period. The means that common mode noise at IP and IN will shift both the gates and sources of the transistors QN1, QP1, QN2, and QP2, and thus the currents Ipp, Ipn, Inp, and Inn would be unchanged. The common mode noise through the voltage reference Vcm is therefore fully rejected.

In greater detail, during the reset period, the operation of the switches S1, S2, S3, and S4 fixes the gate to source voltages of the transistors QN1, QP1, QN2, and QP2, and capacitors C1, C2 and C3, C4 serve to store these voltages. In turn, this fixes currents Ipp, Ipn and Inp, Inn respectively flowing through transistors QN1, QP1, and QN2, QP2. After the reset, switches S1, S2, S3, S4 are opened. Since the capacitors C1, C2 and C3, C4 have stored the gate to source voltages of QN1, QP1, and QN2, QP2, biasing is conserved. Therefore, the currents Ipp, Ipn, Inp, Inn remain unchanged after the switches S1, S2, S3, S4 are opened.

During the scanning period, if there is a differential voltage between inputs IN and IP, current is to be supplied to Cp1, then Ipp increases by $\Delta$Ipp, and Ipn decreases by $\Delta$Ipn. The difference between (Ipp+$\Delta$Ipp) and (Ipn−$\Delta$Ipn) flows into Cp1 and is amplified and mirrored as the output current OutP by the current mirrors formed by transistors T1, T2 and T3, T4.

If differential voltages at the inputs IN and IP result in current to be supplied to Cp2, then Inp increases by $\Delta$Inp, and Inn decreases by $\Delta$Inn. The difference between (Inp+$\Delta$Inp) and (Inn−$\Delta$Inn) flows into Cp2, and is amplified and mirrored as the output current OutN by the current mirrors formed by transistors T5, T6 and T7, T8.

Display noise received at the inputs IN and IP is time varying through Cp1-Cp2, and is therefore coupled through to the gates of QN1, QP1, QN2, and QP2 through capacitors C1, C2, C3, C4. Thus, the display noise Vdn1 from sense line 101a is fed to both the gates and sources of those transistors, and consequently the gate to source voltages do not change due to the common mode noise within the display noise Vdn1, and instead changes due to a differential voltage between inputs IN and IP. Likewise, the display noise Vdn2 from sense line 101b is fed to both the gates and sources of those transistors, and consequently the gate to source voltages do not change due to the common mode noise within the display noise Vdn2, and instead changes due to a differential voltage between inputs.

This operation not only rejects the common display noise, but also boosts the transconductance of the C2I 116 by a factor of two.

Although charge to current converter circuit 116 is described, any charge converter circuits may be used, such as charge to voltage converter circuits. In addition, it should be appreciated that there may be any number of charge to current converter circuits 116, such as one charge to current converter circuit 116 per two sense lines, although in some cases the charge to current converter circuits 116a, 116b are coupled to different sets of sense lines via a multiplexer. The reference generation circuit 115 may be common to each charge to current converter circuit, as may the switches S1, S2, S3 and S4.

Many modifications and other embodiments will come to the mind of one skilled in the art having the benefit of the teachings presented in the foregoing descriptions and the associated drawings. Therefore, it is understood that various modifications and embodiments are intended to be included within the scope of the appended claims.

The invention claimed is:

1. A charge converter for use in a touch screen, the charge converter comprising:
   a differential input stage comprising:
   a first NMOS transistor having a gate, and having a source to be coupled to a first differential sense node;

a second NMOS transistor having a gate, and having a source to be coupled to a second differential sense node;
a first PMOS transistor having a gate, and having a source to be coupled to the first differential sense node;
a second PMOS transistor having a gate, and having a source to be coupled to the second differential sense node;
a first switching circuit selectively coupling a first voltage reference to the gate of the first and second NMOS transistors;
a second switching circuit selectively coupling a second voltage reference to the gate of the first and second PMOS transistors;
a conversion circuit having first and second inputs to be coupled to the first and second differential sense nodes respectively, and configured to convert a difference in charge between the first and second differential sense nodes.

2. The charge converter of claim 1, further comprising a first capacitive coupling between the gate of the first NMOS transistor and the second differential sense node, a second capacitive coupling between the gate of the second NMOS transistor and the first differential sense node, a third capacitive coupling between the gate of the first PMOS transistor and the second differential sense node, and a fourth capacitive coupling between the gate of the second PMOS transistor and the source of the first PMOS transistor.

3. The charge converter of claim 2, wherein the first, second, third, and fourth capacitive couplings result in a transient component of noise received at the first and second differential sense nodes being applied to the gates and sources of the first and second NMOS transistors and first and second PMOS transistors.

4. The charge converter of claim 2, wherein the first, second, third, and fourth capacitive couplings comprise first, second, third, and fourth capacitors.

5. The charge converter of claim 1, further comprising:
a reference NMOS transistor having a source coupled to receive a third voltage reference and a gate coupled to the gates of the first and second NMOS transistors through the first switching circuit;
a reference PMOS transistor having a source coupled to the source of the reference NMOS transistor and a gate coupled to the gates of the first and second PMOS transistors through the second switching circuit.

6. An electronic device, comprising:
a sensing layer including a plurality of sense lines;
a display layer generating display noise based on scanning thereof;
wherein the display noise is capacitively coupled from the display layer to each of the plurality of sense lines of the sensing layer; and
a differential charge converter circuit having first and second differential inputs respectively coupled to corresponding ones of the plurality of sense lines, and first and second reference inputs;
wherein the first and second differential inputs of the differential charge converter circuit are coupled to voltage references during a reset period, and are decoupled from the voltage references during a scan period.

7. The electronic device of claim 6, wherein the differential charger converter circuit has first and second reference inputs; and wherein the first differential input and the second reference input are capacitively cross coupled, and the second differential input and the first reference input are capacitively cross coupled.

8. The electronic device of claim 7, wherein the differential charge converter circuit comprises:
a differential input stage comprising:
a first NMOS transistor having a gate for selective coupling to the first reference input, and a source to be coupled to the first differential input;
a second NMOS transistor having a gate for selective coupling to the first reference input, and a source to be coupled to the second differential input;
a first capacitive coupling between the gate of the first NMOS transistor and the source of the second NMOS transistor;
a second capacitive coupling between the gate of the second NMOS transistor and the source of the first NMOS transistor
a first PMOS transistor having a gate for selective coupling to the second reference input and a source to be coupled to the first differential input;
a second PMOS transistor having a gate for selective coupling to the second reference input and a source to be coupled to the second differential input;
a third capacitive coupling between the gate of the first PMOS transistor and the source of the second PMOS transistor; and
a fourth capacitive coupling between the gate of the second PMOS transistor and the source of the first PMOS transistor;
wherein the first, second, third, and fourth capacitive couplings result in a transient component of noise received at the first and second differential inputs being applied to the gates and sources of the first and second NMOS transistors and first and second PMOS transistors; and
a conversion circuit to be coupled to the first and second differential inputs and configured to convert charge at the first and second differential inputs.

9. The electronic device of claim 8, further comprising a first switch selectively coupling a first voltage reference to the first reference input, and a second switch selectively coupling a second voltage reference to the second reference input.

10. The electronic device of claim 9, further comprising:
a reference NMOS transistor having a source coupled to receive a third voltage reference and a gate coupled to the first reference input through the first switch; and
a reference PMOS transistor having a source coupled to the source of the reference NMOS transistor and a gate coupled to the second reference input through the second switch.

11. The electronic device of claim 8, wherein the first, second, third, and fourth capacitive couplings comprise first, second, third, and fourth capacitors.

12. The electronic device of claim 6, further comprising an accumulator circuit configured to accumulate outputs of the differential charge converter circuits and to generate an accumulator output.

13. The electronic device of claim 12, wherein the accumulator circuit accumulates outputs of the differential charge converter circuits simultaneously.

14. A method, comprising:
capacitively coupling display noise from a display layer to each of a plurality of sense lines;

coupling a plurality of differential charge converter circuits to the plurality of sense lines and to voltage references during a reset period; and coupling the plurality of differential charge converter circuits to the plurality of sense lines and not to the voltage references during a scan period, so as to reject the display noise.

15. The method of claim 14, further comprising rejecting the display noise during the scan period by capacitively coupling the display noise to gates and sources of capacitively cross coupled transistors of the plurality of differential charge converter circuits.

16. The method of claim 14, wherein coupling the plurality of differential charge converter circuits to the voltage references during the reset period comprises closing switches coupling each of the plurality of sense lines to each of the plurality of differential charge converter circuits during the reset period; and wherein not coupling the plurality of differential charge converter circuits to the voltage references during the scan period comprises opening the switches during the scan period.

17. A charge converter for use in a touch screen, the charge converter comprising:
a differential input stage comprising:
first and second transistors coupled by a first differential input node and in series between first and second current sources;
third and fourth transistors coupled by a second differential input node and in series between third and fourth current sources;
first and second capacitors cross coupling the first and third transistors;
third and fourth capacitors cross coupling the second and fourth transistors;
a first switch selectively coupling control terminals of the first and third transistors to a first voltage reference; and
a second switch selectively coupling control terminals of the second and fourth transistors to a second voltage reference; and
a conversion circuit coupled to the first and second differential input nodes and configured to convert charge at the first and second differential input nodes.

18. The charge converter of claim 17, wherein the first and second switches are controlled to be closed during a reset period and open during a scan period.

19. The charge converter of claim 17, wherein the first and third capacitors are coupled; and wherein the second and fourth capacitors are coupled.

20. An electronic device, comprising:
a sensing layer including a plurality of sense lines;
a display layer generating display noise based on scanning thereof;
a common voltage layer coupled to the display layer and the sensing layer, the common voltage layer capacitively coupling the display noise from the display layer to each of the plurality of sense lines of the sensing layer;
a plurality of charge converter circuits each comprising:
a differential input stage comprising:
first and second transistors coupled by a first differential input node and in series between first and second current sources;
third and fourth transistors coupled by a second differential input node and in series between third and fourth current sources;
a first switch selectively coupling control terminals of the first and third transistors to a first voltage reference; and
a second switch selectively coupling control terminals of the second and fourth transistors to a second voltage reference;
wherein the first and second differential input nodes are coupled to different ones of the plurality of sense lines; and
a conversion circuit coupled to the first and second differential input nodes and configured to convert charge at the first and second differential input nodes.

21. The electronic device of claim 20, further comprising first and second capacitors cross coupling the first and third transistors, and third and fourth capacitors cross coupling the second and fourth transistors.

22. The electronic device of claim 21, wherein the first and third capacitors are coupled; and wherein the second and fourth capacitors are coupled.

23. The electronic device of claim 20, wherein the first and second switches are controlled to be closed during a reset period and open during a scan period.

24. The electronic device of claim 20, further comprising:
an accumulator circuit configured to accumulate outputs of the charge converter circuits and to generate an accumulator output; and
a digital to analog converter configured to generate a digital output representing touch data, from the accumulator output.

* * * * *